United States Patent [19]

Gustafsson

[11] 3,960,010
[45] June 1, 1976

[54] ANALOG-DIGITAL CONVERTER FOR A RESISTANCE BRIDGE

[75] Inventor: Jan Kenneth Gustafsson, Karlskoga, Sweden

[73] Assignee: AB Bofors, Bofors, Sweden

[22] Filed: Oct. 21, 1974

[21] Appl. No.: 516,845

[30] Foreign Application Priority Data

Oct. 23, 1973 Sweden .............................. 7314340

[52] U.S. Cl. .............................. 73/88.5 R; 324/105
[51] Int. Cl.² .......................................... G01B 7/16
[58] Field of Search .................. 73/88.5 R; 324/105

[56] References Cited
UNITED STATES PATENTS

| | | | |
|---|---|---|---|
| 3,582,777 | 6/1971 | Wunderman ........................ | 324/105 |
| 3,714,806 | 2/1973 | Berkey et al. ...................... | 73/88.5 R |
| 3,791,204 | 2/1974 | List et al. .......................... | 73/88.5 R |
| 3,868,848 | 3/1975 | Senour .............................. | 73/88.5 R |

*Primary Examiner*—Charles A. Ruehl
*Attorney, Agent, or Firm*—Pollock, Vande Sande & Priddy

[57] ABSTRACT

Apparatus which provides a digital signal which represents the unbalance in a resistance bridge. The apparatus includes a source of direct-current voltage which is applied alternately and repetitively with opposite polarity to input terminals of the bridge. An amplifier is connected to the bridge output terminals. Analog-to-digital converters are connected to the output of the amplifier in such a way that one converter is connected to the amplifier output at a time when a positive voltage is applied to the bridge input and another converter is applied to the amplifier output at the time that a negative voltage is applied to the bridge input. A count is provided which represents the difference in the digital signals provided by the two converters. Such output is unaffected by any initial unbalance in the amplifier and is also not responsive to thermoelectrically generated electromotive forces.

4 Claims, 2 Drawing Figures

ANALOG-DIGITAL CONVERTER FOR A RESISTANCE BRIDGE

The present invention relates to an analog-digital converter for measuring the unbalance in a resistance bridge, particularly a converter for application to force transducers based on strain gauges.

When converting the unbalance of a resistance bridge into a digital value, it is known to convert the output signal from the bridge into a digital form with the aid of a double ramp intregrating voltmeter. A voltage output signal is provided by the bridge as a measure of its degree of unbalance. In practical applications, with a resistance bridge of the strain gauge type, the output signal may be as low as 5 mV, and as a resolution of 10,000 units can be desired, a unit in the conversion corresponds to 0.5 $\mu$V. In order to be able to convert the signal easily, the signal is often first amplified approximately 100 times, to give a more easily convertible signal level for the analog-digital converter, and to give the instrument a higher input impedance.

When the bridge is fed with D.C. voltage, the digitally converted value will contain both the output signal of the resistance bridge and thermoelectrically generated electromotive forces, as well as the input unbalance of the amplifier. Both the input unbalance of the amplifier and the thermoelectrically generated electromotive forces are dependent on the temperature, and great care must be taken to compensate these.

To eliminate amplifier drift, it is previously known to feed a resistance bridge with A.C. voltage, and said thermoelectromotive forces and amplifier drift will then not have any influence on the measuring result. On the other hand, it is relatively complicated to regulate the amplitude of the feed voltage, and in the feed conductors or in the actual bridge components, disturbing reactances will occur which falsify the measuring result. Moreover, the A.C. voltage signal must be rectified after amplification.

In order to eliminate amplifier drift in systems operating with D.C. feed of the resistance bridge, and the output signal of which is amplified in a D.C. amplifier before the digital conversion, improved analog-digital converters are now designed with different automatic zero-setting methods. The influence of amplifier drift on amplifier, integrator and comparator is eliminated in these converters, but on the other hand, the influence of thermoelectric electromotive forces is not compensated. To compensate these too, it is known to install an analog memory, a so-called trap circuit, which first stores the amplified output signal from the resistance bridge with feed, and thereafter converts the difference between the amplified signal with feed and the amplified signal from the resistance bridge without feed. In this way, both the influence of the amplifier unbalance and thermoelectromotive forces can be eliminated. A substantial drawback of the abovementioned method is that a correct mean time value of the output signal of the bridge cannot be obtained at low disturbance frequencies, as the analog filtering is interrupted at the conversion when the feed voltage of the bridge is disconnected. Owing to this, a long time must pass for the setting of the filter between each conversion, which is often inexpedient. For digital filtering, a higher conversion speed is desired, and errors are then obtained owing to the fact that, at high conversion speeds, the feed voltage is not connected, and the condition of the bridge is thus not sensed during a large portion of the time.

The purpose of the present invention is to achieve an analog-digital converter for measuring the unbalance of a resistance bridge, e.g. a strain gauge bridge, which compensates for both thermoelectromotive forces and amplifier unbalance.

The feature that can mainly be considered to be characteristic of a converter according to the invention is that the voltage feed of the bridge and the analog-digital conversion has two phases, and that during the first phase the bridge is fed with a voltage of one polarity, and during the second phase it is fed with a voltage of the opposite polarity, the feed voltage in the respective phases then being of constant amplitude, and that the conversion into digital representation of the analog output signal of the bridge takes place during both phases, and that a digital value is formed by these two or more conversions in such a way that the amplifier unbalance and thermoelectromotive forces are not included in the digital value formed.

According to an advantageous embodiment of the invention, the amplified output signal from the bridge is converted with two double ramp analog-digital converters, which are synchronized so that the first analog-digital converter integrates the signal from the amplifier during substantially the whole time the bridge is connected to a positive feed voltage and the other analog-digital converter integrates the signal from the amplifier during substantially the whole time the bridge is connected to the negative feed voltage. Thereafter, the difference between the two conversions is formed, and a digital value is then obtained which does not contain any contribution from the amplifier unbalance or thermoelectromotive forces. The signal from the resistance bridge is integrated during the major portion of the total time, although not during the time required to change the polarity, and digital filtering can be used, with good results.

The invention will be described in more detail in the following, with reference to the attached drawings.

Figure 1:
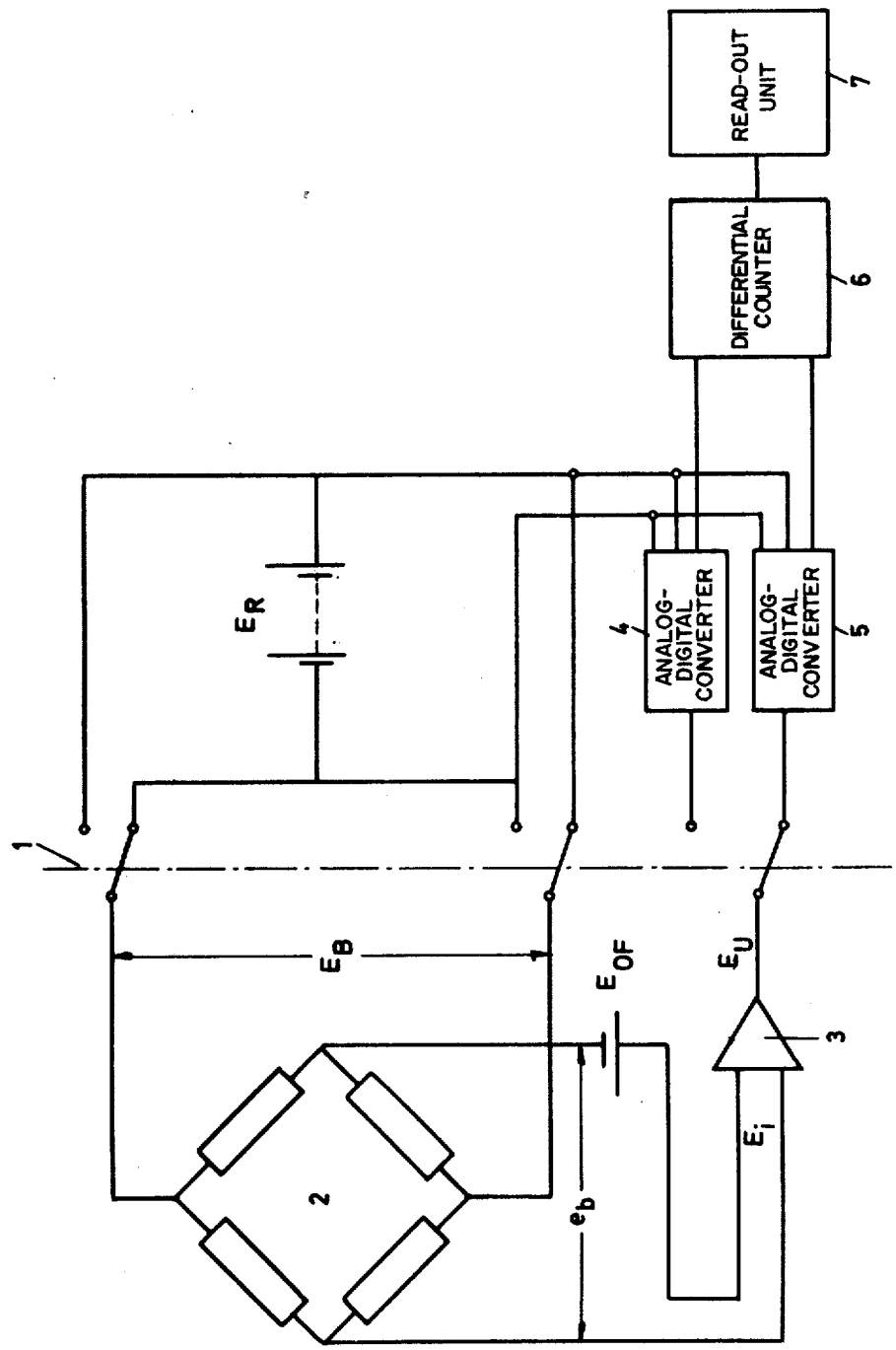
FIG. 1 shows partly in block form an analog-digital converter according to the principles of the invention.

As shown in FIG. 1, the analog-digital converter comprises a resistance bridge 2, fed from a D.C. voltage source ($E_R$) via a change-over switch 1. The resistance bridge comprises a conventional Wheatstone bridge, which has one of its diagonals connected to the D.C. voltage source ($E_R$) via the change-over switch 1, and has its other diagonal connected to an amplifier 3.

It is particularly conceived that the resistance bridge is to be used for force transducers, and then, in a known way, the elements of the bridge comprises strain gauges. Through appropriate positioning of the four strain gauges on a member subjected to deformation, the unbalance measured in the bridge will then comprise a measure of the magnitude of the force that causes the deformation. The output signal ($e_B$) from the bridge, together with the unbalance voltage for the amplifier and thermoelectromotive force from the installation ($E_{OF}$), are amplified in the D.C. voltage amplifier 3. During the positive feed period, the output voltage ($E_u$) from the amplifier is connected to a first double ramp analog-digital converter 4, and during the negative feed period, to a second double ramp analog-digital converter 5. The switching between the two analog-digital converters is synchronized with the change-over switch 1 for the voltage feed. Both of the analog-digital converters are connected to the D.C. voltage source ($E_R$) which serves as a reference voltage. The output signals of the analog-digital converter are connected to a difference counter 6, which calculates a digital value representative of the difference between the two conversions. The output signal from the difference counter in connected to a read out unit 7 for presentation of the measuring result. From the following mathematical relations, it will be noted that the difference signal does not contain any contribution from amplifier unbalance or thermoelectromotive force.

The following relations are applicable:

1. During positive feed polarity
$$E_B = E_R$$
$$e_B = K \cdot E_B$$
$$E_i = e_B - E_{OF}$$
$$E_u = AE_i$$
Insertion gives:
1.
$$E_u = A(K E_R - E_{OF})$$

2. During negative feed polarity
$$E_B = -E_R$$
$$e_B = K \cdot E_B$$
$$E_i = e_B - E_{OF}$$
$$E_u = AE_i$$

2.
$$E_u = -A(K E_R + E_{OF})$$

From a value representing the quotient $E_u/E_R$ during 1, a value representing the quotient $E_u/E_R$ during 2 is subtracted, and the result then represents the unbalance of the bridge without any influence of $E_{OF}$, as follows:

$$\frac{A(K \cdot E_R - E_{OF}) + A(K \cdot E_R + E_{OF})}{E_R} = 2 AK$$

In the equations above, $K$ designates the unbalance in the resistance bridge and $A$ the amplification of the D.C. voltage amplifier 3.

As will be noted, the influence of the amplifier unbalance and the thermoelectromotive force is eliminated entirely if these have the same value during the two phases. As the change of amplifier unbalance and thermoelectromotive force are very slow processes, both following ambient temperature changes, and as the two phases are passed through several times a second, these voltages can be regarded as being fixed in the equations above.

Figure 2:
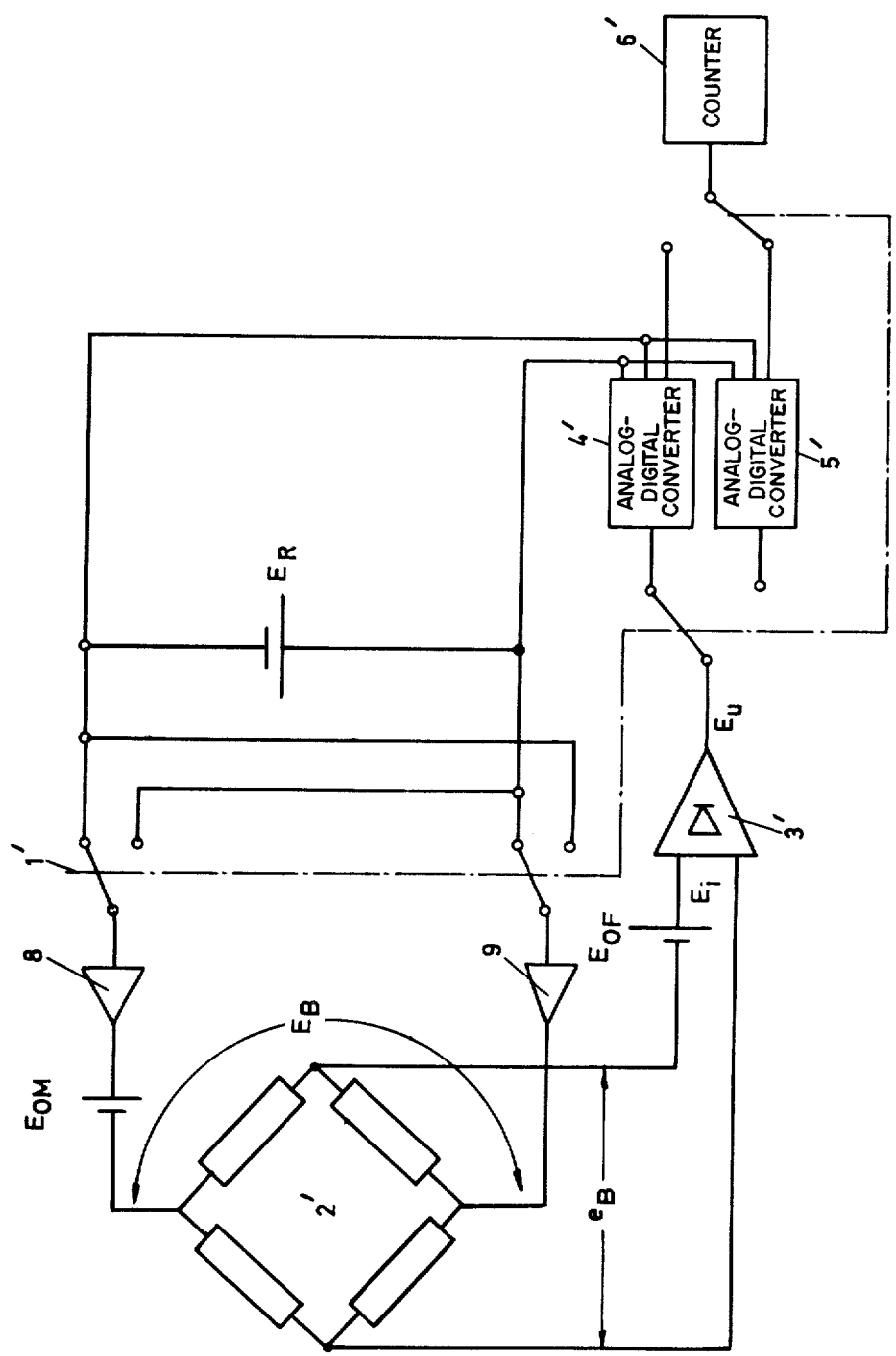
FIG. 2 shows another variant of the invention, in which differences in the amplitude of the positive and negative feed voltage do not have any influence on the result.

FIG. 2 shows another variant of an analog-digital converter for measuring the unbalance in a resistance bridge which is connected in such a way that the difference in the amplitude of the positive and the negative feed voltage caused by unbalance in the bridge feed amplifiers 8, 9 does not have any influence on the result. In this case, an absolute value rectifying amplifier 3' is used, which makes it possible to used more simple analog-digital converter connections. In order that the value converted with this connection should be applicable, $|e_B|$ must be greater than $|E_{OF}|$. The D.C. voltage source ($E_R$) is connected to one of the diagonals of the resistance bridge 2' via the change-over switch 1'. In the conductors to the bridge, there are two bridge-measuring amplifiers 8, 9, which cause an unbalance voltage $E_{OM}$. As in the case of FIG. 1, $E_B$ constitutes the bridge feed voltage. The output signal $e_B$ from the resistance bridge, together with the unbalance voltage from the amplifier and the thermoelectromotive force from the installation ($E_{OF}$) gives rise to the input voltage ($E_i$) to the absolute value rectifying amplifier 3'. The output voltage ($E_u$) from the amplifier is connected synchronously with the change-over switch 1' during the positive feed period to a first analog-digital converter 4' and during the negative feed period to a second analog-digital converter 5'. As in the case of FIG. 1, both of the analog-digital converters are connected to a reference voltage, the D.C. voltage source $E_R$. The output signals from the two analog-digital converters are fed to a counter 6', which calculates a digital value, which comprises the sum of the two conversions. The following mathematical relation is applicable to the connection according to FIG. 2.

1. During positive feed polarity
$$E_B = E_R + E_{OM}$$
$$e_B = K \cdot E_B$$
$$E_i = e_B - E_{OF}$$
$$E_u = A E_i$$
Insertion gives:
1.
$$E_u = A(K(E_R + E_{OM})-E_{OF})$$

2. During negative feed polarity
$$E_B = -E_R + E_{OM}$$
$$e_B = K \cdot E_B$$
$$E_i = e_B - E_{OF}$$
$$E_u = -A E_i$$

2.
$$E_u = -A(K(-E_R + E_{OM})-E_{OF})$$

A pulse train representing the voltage $E_u/E_R$ during 1 is counted in the counter and thereafter a pulse train representing the voltage $E_u/E_R$ during 2. This sum is read off, and thereafter the counter is set at zero. The sum is formed by the expressions $$\frac{A(K(E_R + E_{OM})-E_{OF}) - A(K(-E_R + E_{OM})-E_{OF})}{E_R} = 2 AK$$

It will be noted that, as previously, the influence of unbalance and thermoelectromotive fource is eliminated and that, moreover, the influence of the unbalance of the bridge feed amplifiers is eliminated.

The invention is not limited to the embodiments shown above as examples, but can be subject to modifications within the scope of the following claims. Thus, for instance, for certain applications, it can be appropriate, instead of having two analog-digital converters, to use one single analog-digital converter of e.g. VCO type, which receives the amplified output signal from the bridge during both phases. In certain cases, it can also be appropriate to allow the digital value to be formed by more than two conversions.

I claim.

1. Apparatus for providing a digital signal representative of the unbalance of a resistance bridge comprising:
    a resistance bridge having input means and output means, means for applying first and second direct-current voltages of opposite polarity but equal amplitude alternately and repetitively to said input means, amplifier means connected to said output means, analog-to-digital converter means responsive to said amplifier means, counting means controlled by said converter means, and means controlling said counting means to count in one sense while said first voltage is applied to said input means and in the opposite sense while said second voltage is applied to said input means.

2. The combination of claim 1 wherein said counting means counts the output of said converter means in said one sense throughout the time said first voltage is applied to said input means and said counting means counts the output of said converter means in the opposite sense throughout the time said second voltage is applied to said input means.

3. The combination of claim 1 which also includes a common voltage source and pole-changing means operating repetitively to alternate the polarity of said common voltage to provide thereby said first and second voltages, said converter means including a pair of converters which are alternately connected to said amplifier means by said pole changing means, and said counting means comprising a differential counter responsive to the outputs of both said converters concurrently.

4. The combination of claim 1 which also includes a common voltage cource and pole-changing means operating repetitively to alternate the polarity of said common voltage to provide thereby said first and second voltages, said input means including amplifier means, said converter means including a pair of converters which are alternatively connected to said amplifier means by said pole-changing means, and said counting means counts the sum of the outputs of said converters.

* * * * *